United States Patent
Lin

(10) Patent No.: US 10,276,291 B2
(45) Date of Patent: Apr. 30, 2019

(54) CHOKE COIL MODULE OF HIGH POWER DENSITY DC-AC POWER INVERTER

(71) Applicant: CHYNG HONG ELECTRONIC CO., LTD., Taichung (TW)

(72) Inventor: Mu-Chun Lin, Taichung (TW)

(73) Assignee: CHYNG HONG ELECTRONIC CO., LTD., Taichung (TW)

( * ) Notice: Subject to any disclaimer, the term of this patent is extended or adjusted under 35 U.S.C. 154(b) by 190 days.

(21) Appl. No.: 15/482,502

(22) Filed: Apr. 7, 2017

(65) Prior Publication Data

US 2018/0294086 A1 Oct. 11, 2018

(51) Int. Cl.
| | | |
|---|---|---|
| *H01F 27/02* | (2006.01) | |
| *H01F 27/20* | (2006.01) | |
| *H01F 27/28* | (2006.01) | |
| *H05K 7/20* | (2006.01) | |
| *H02M 7/00* | (2006.01) | |
| *H02M 7/42* | (2006.01) | |

(52) U.S. Cl.
CPC ........... *H01F 27/20* (2013.01); *H01F 27/025* (2013.01); *H01F 27/28* (2013.01); *H02M 7/003* (2013.01); *H05K 7/20909* (2013.01); *H02M 7/42* (2013.01)

(58) Field of Classification Search
CPC .............................. H01F 27/20; H01F 27/025
USPC .................................. 336/90, 92, 94, 96, 98
See application file for complete search history.

(56) References Cited

U.S. PATENT DOCUMENTS

| | | | | | |
|---|---|---|---|---|---|
| 2,934,748 | A | * | 4/1960 | Steimen | G11C 5/05 29/604 |
| 3,372,358 | A | * | 3/1968 | Roy | H01F 27/2804 174/254 |
| 4,888,572 | A | * | 12/1989 | Tinley | H01F 27/027 336/65 |
| 8,837,119 | B2 | * | 9/2014 | Kishimoto | H02M 5/271 307/126 |
| 2010/0079228 | A1 | * | 4/2010 | Halpin | H01F 27/04 336/96 |
| 2015/0380147 | A1 | * | 12/2015 | Takano | H02M 1/126 333/185 |

FOREIGN PATENT DOCUMENTS

| | | | |
|---|---|---|---|
| CN | 204926962 U | * 12/2015 | |
| EP | 2346128 A1 | * 7/2011 | ......... H02B 13/0356 |
| EP | 2682957 A1 | * 1/2014 | ........... H01F 27/085 |

\* cited by examiner

*Primary Examiner* — Tszfung J Chan
(74) *Attorney, Agent, or Firm* — Ming Chow; Sinorica, LLC

(57) ABSTRACT

A choke coil module of a high power density DC-AC power inverter includes a retainer. The retainer includes a lower plate and an upper plate. The upper and lower plates are spaced from each other and have two slots, respectively. An accommodation space of the retainer is provided with two choke coils which are disposed obliquely in a stagger manner. Top portions and bottom portions of the choke coils protrude out of and lean against the slots of the upper plate and the lower plate, respectively. The outside air is guided by a fan unit to enter a casing through air inlets, and the heat generated by the choke coils is expelled to the outside through air outlets. The choke coil module can be mounted in a smaller casing, such as a casing with a height of 2 U, to achieve excellent heat dissipation.

5 Claims, 4 Drawing Sheets

CHOKE COIL MODULE OF HIGH POWER DENSITY DC-AC POWER INVERTER

FIELD OF THE INVENTION

The present invention relates to the configuration of a power inverter, and more particularly to a choke coil module of a high power density DC-AC power inverter.

BACKGROUND OF THE INVENTION

Various power inverters have been widely used in electronic circuits (such as power supplies, computers, household appliances, nuclear magnetic resonance gradient amplifiers, UPS uninterruptible power systems, solar inverters, converters, power amplifiers for a vibration test, frequency converter of 400 Hz, 800 Hz, 1200 Hz, etc.) to provide a stable constant voltage or constant current. Its function is that an input power type is converted into a required load power type. In general, a power inverter is composed of a power switch component (such as a power transistor, a power diode, etc.), an electrical energy storage, and a filter component (such as an inductor, a capacitor, a transformer, a choke coil, etc.), and a detection and control component.

Thereby, the voltage or current is adjusted (switched and rectified) by the detection and control component to control the power switch component. The electric energy storage and the filter component provide the required filtering and temporary electrical energy for converting the electric energy. However, during the power conversion, the power inverter converts part of the energy supplied from the power supply into heat energy. The heat energy is concentrated in the power transistor and the choke coil of the power inverter.

The demand for power inverters used for industrial and server applications is extremely large. The power inverters are mounted to a chassis through a rack. A general business gathers power inverters and servers in a computer room to facilitate the management. The power inverters and the servers are running all day long. Therefore, the heat dissipation of the power inverters is particularly important.

For the convenience of management and space saving, the casing for the rack-type power inverter usually adopts a common industrial standard, its width is fixed at 19 inches, height in U units (1 U=1.75 inches=44.45 mm). The standard casings are usually 1 U, 2 U, 3 U, and others. In general, at the same power, the power inverter composed of a power switch component, a power storage, and a filter component, and a detection and control component needs better heat dissipation conditions, so it is necessary to use a larger casing, such as a casing of 3 U or more.

However, in order to reduce the size of the casing, a casing of 2 U or less is developed accordingly. But its configuration design causes poor heat dissipation. The reason is that the power inverter has a plurality of choke coils and a plurality of power transistors. The choke coils are often horizontally arranged in the limited space, so the heat is concentrated at the bottoms of the choke coils. The power transistors and other electronic components are generally vertically arranged on the circuit board, which shields the wind blowing of the fan and cannot provide a smooth heat dissipation path. As a result, the heat is concentrated at the power transistors and the choke coils of the power inverter. The power inverter may stop running or fail or be damaged due to overheating.

Accordingly, the inventor of the present invention has devoted himself based on his many years of practical experiences to solve these problems.

SUMMARY OF THE INVENTION

The primary object of the present invention is to provide a choke coil module of a high power density DC-AC power inverter. The choke coil module can be mounted in a smaller casing, such as a casing with a height of 2 U, to achieve excellent heat dissipation. The heat generated by the choke coil of the power inverter won't be accumulated easily and can be expelled to the outside by wind so as to radiate heat quickly.

In order to achieve the aforesaid object, the power inverter comprises a casing. The choke coil module is disposed in the casing. Two sides of the casing are formed with a plurality of air inlets and a plurality of air outlets, respectively. One of the two sides of the casing is provided with a fan unit for guiding outside air to enter the casing from the air inlets and discharge from the air outlets. The choke coil module comprises a retainer and at least one choke coil. The retainer includes a lower plate and an upper plate which are laterally spaced from each other. The lower plate is fixed to a bottom of the casing. The upper plate is located above the lower plate and connected to the lower plate with a plurality of longitudinal locking rods, so that the retainer is formed with an accommodation space between the upper plate and the lower plate. The upper plate and the lower plate each have at least one slot. The choke coil is disposed obliquely in the accommodation space of the retainer. A top portion and a bottom portion of the choke coil protrude out of and lean against the slots of the upper plate and the lower plate, respectively.

When the power inverter is actuated, the choke coil generates heat, the outside air is guided by the fan unit to enter the casing through the air inlets, and the heat generated by the choke coil is expelled to the outside through the air outlets of the casing. The choke coil module can be mounted in a smaller casing, such as a casing with a height of 2 U, to achieve excellent heat dissipation.

DETAILED DESCRIPTION OF THE PREFERRED EMBODIMENTS

Embodiments of the present invention will now be described, by way of example only, with reference to the accompanying drawings.

Figure 1:
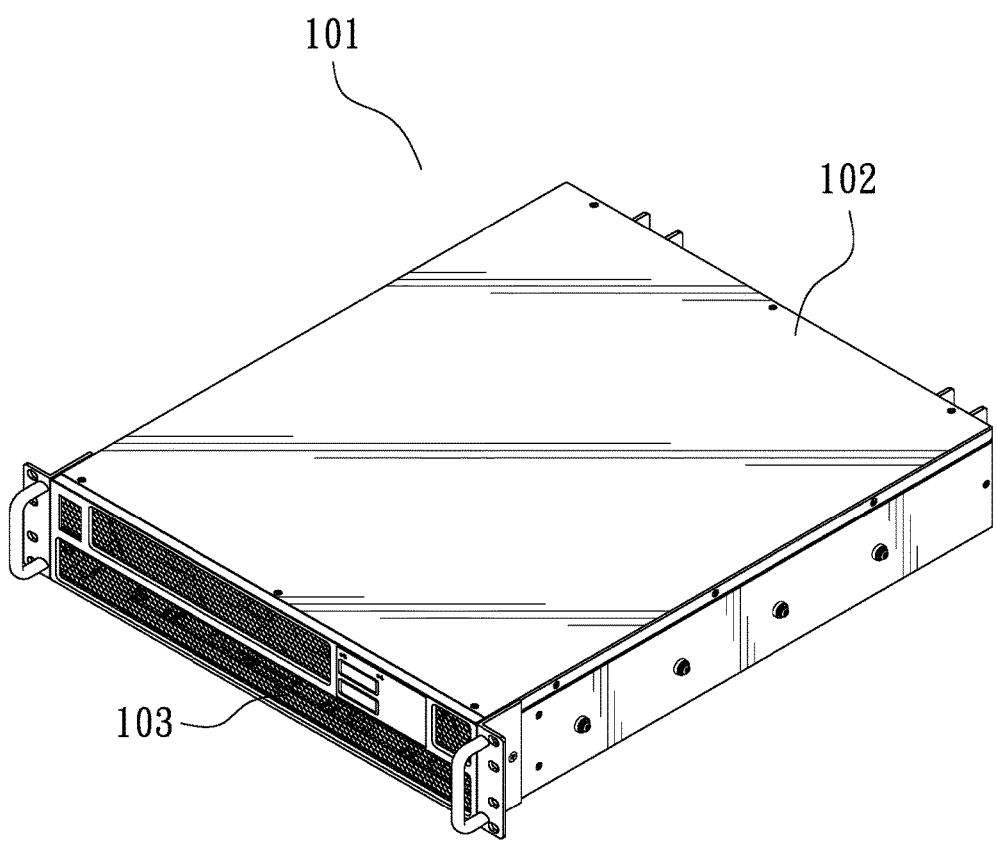
FIG. 1 is a perspective view of the present invention.
Figure 2:
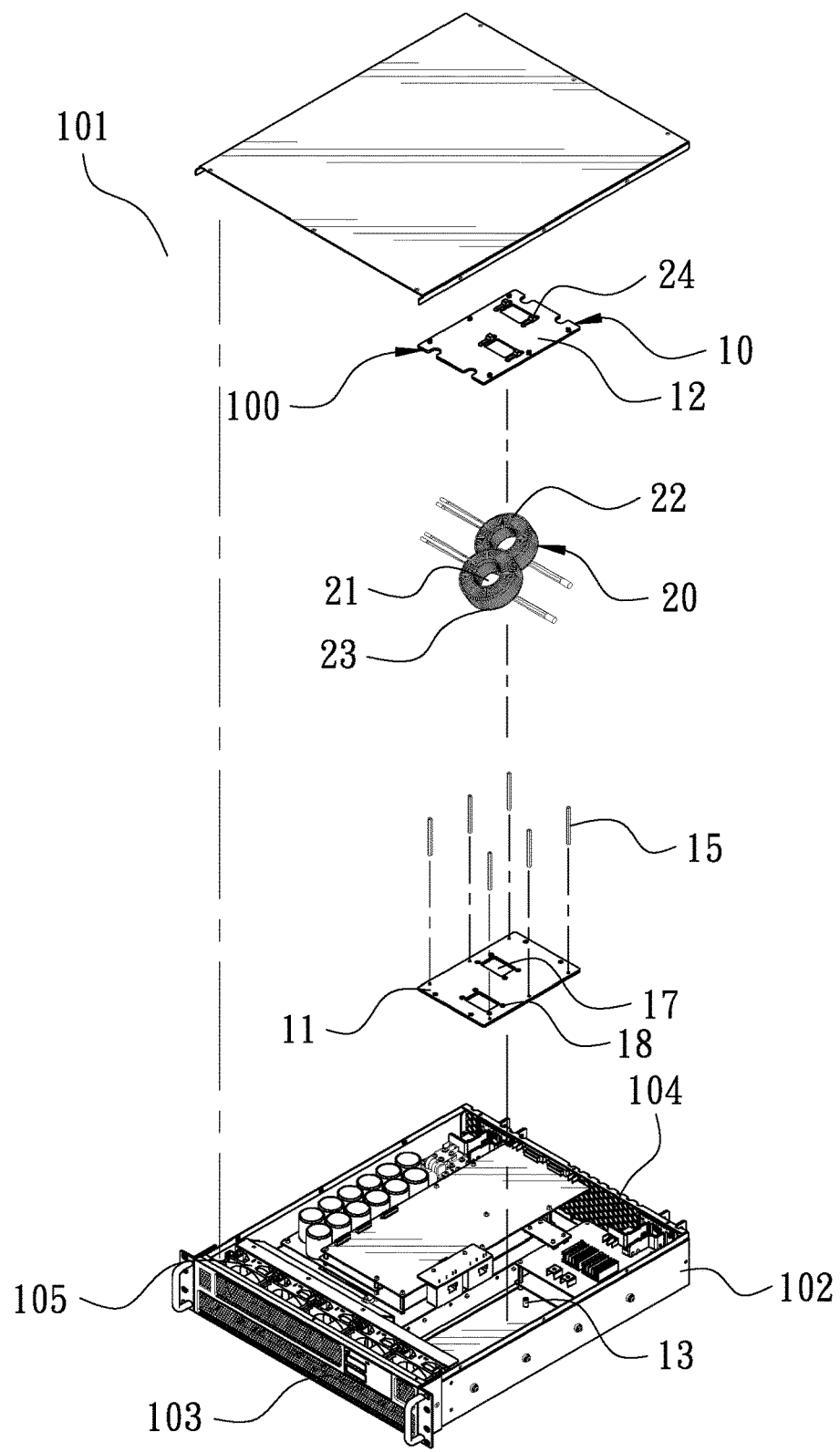
FIG. 2 is an exploded view of the present invention.
Figure 3:
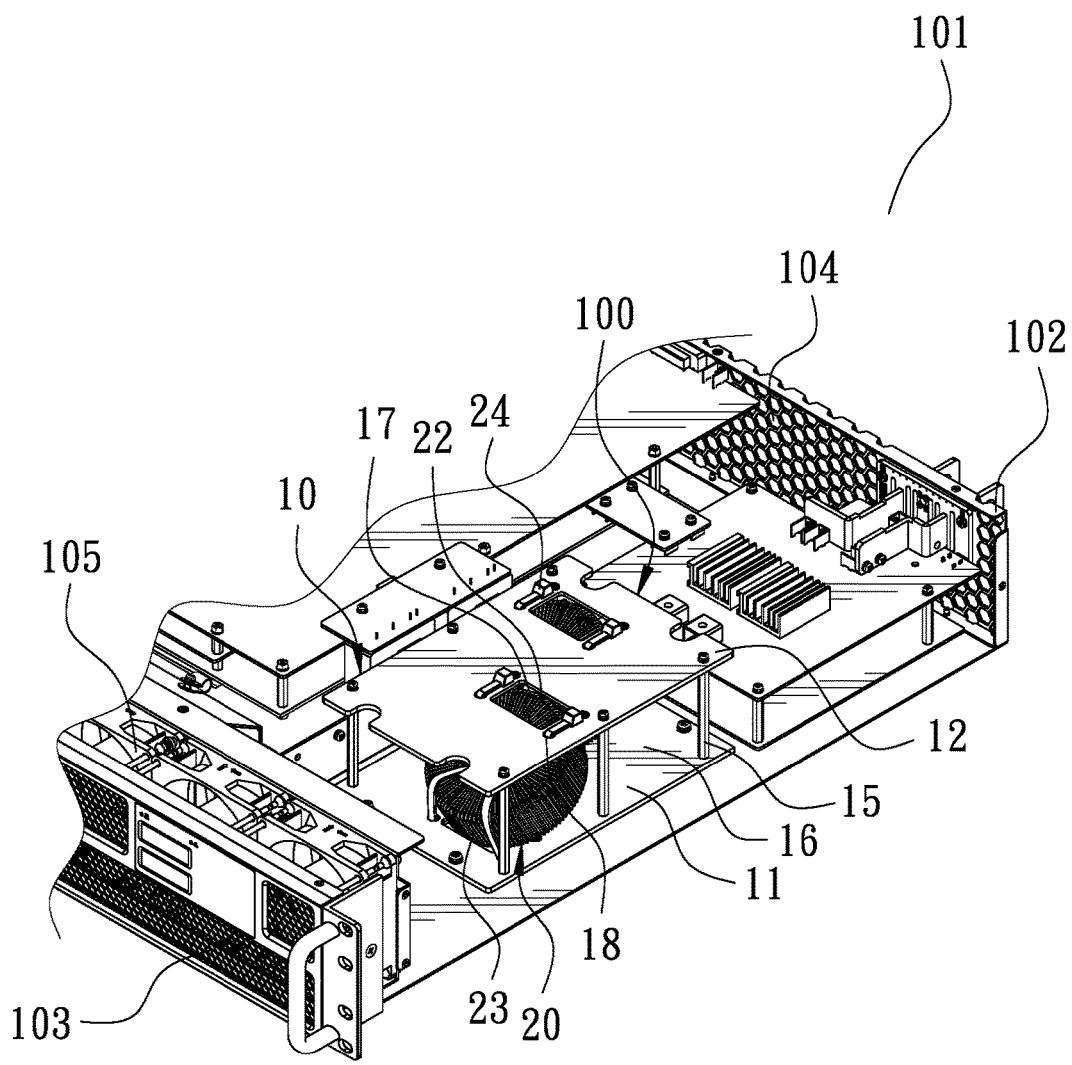
FIG. 3 is a sectional view of the present invention, showing the choke coil module mounted in the casing.

FIG. 1 is a perspective view of the present invention. FIG. 2 is an exploded view of the present invention. FIG. 3 is a sectional view of the present invention. The present invention discloses a choke coil module 100 of a high power density DC-AC power inverter 101. The power inverter 101 comprises a casing 102. The choke coil module 100 is disposed in the casing 102. Two sides of the casing 102 are formed with a plurality of air inlets 103 and a plurality of air outlets 104, respectively. One of the two sides of the casing 102 is provided with a fan unit 105 for guiding the outside air to enter the casing 102 from the air inlets 103 and discharge from the air outlets 104. The choke coil module 100 includes a retainer 10 and at least one choke coil 20.

The retainer 10 includes a lower plate 11 and an upper plate 12 which are laterally spaced from each other. The lower plate 11 is fixed to the bottom of the casing 102. The lower plate 11 of the retainer 10 is fixedly connected to the bottom of the casing 102 through a plurality of support posts 13, so that a gap 14 is formed between the lower plate 11 of the retainer 10 and the bottom of the casing 102. The upper plate 12 is located above the lower plate 11. The upper plate 12 is connected to the lower plate 11 with a plurality of longitudinal locking rods 15, so that the retainer 10 is formed with an accommodation space 16 between the upper plate 12 and the lower plate 11. The upper plate 12 and the lower plate 11 each have two slots 17. The slots 17 of the upper plate 12 and the slots 17 of the lower plate 11 have a rectangular shape. The retainer 10 is formed with a plurality of fixing holes 18 around a peripheral side of the slots 17 of the upper plate 12 and a peripheral side of the slots 17 of the lower plate 11, respectively.

In an embodiment of the present invention, the choke coil module 100 has two choke coils 20. The choke coils 20 each have a through hole 21. The choke coils 20 are disposed in the accommodation space 16 of the retainer 10 in a staggered manner, and are disposed obliquely in the accommodation space 16 of the retainer 10. The choke coils 22 and the through holes 22 slant from bottom to top toward the air outlets 104 of the casing 102. Top portions 22 and bottom portions 23 of the choke coils 20 protrude out of and lean against the slots 17 of the upper plate 12 and the lower plate 11, respectively. The choke coils 20 may be fixed to the upper plate 12 and the lower plate 11 through a plurality of fastening wires 24 and the fixing holes 18.

FIG. 3 is a sectional view of the present invention, showing the choke coil module 100 mounted in the casing 102. When the power inverter 101 is actuated, the choke coils 20 generate heat and the heat is conducted to the surroundings of the choke coils 20. Meanwhile, the fan unit 105 guides the outside air to enter the casing 102 through the air inlets 103 to radiate the heat for the choke coils 20, and the wind blows the heat to the air outlets 104 of the casing 102 so that the heat is expelled to the outside, achieving rapid heat dissipation.

Referring to FIG. 3, the retainer 10 is formed with the plurality of fixing holes 18 around the peripheral side of the slots 17 of the upper plate 12 and the peripheral side of the slots 17 of the lower plate 11. The top portions 22 and the bottom portions 23 of the choke coils 20 protrude out of and lean against the slots 17 of the upper plate 12 and the lower plate 11 respectively to form an engagement. The choke coils 20 can be fixed to the upper plate 12 and the lower plate 11 through the plurality of fastening wires 24 and the fixing holes 18, so that the choke coils 20 are fixed and arranged obliquely in the accommodation space 16 of the retainer 10.

FIG. 3 is a sectional view of the present invention, showing the choke coil module 100 mounted in the casing 102. In an embodiment of the present invention, the choke coil module 100 has two choke coils 20. The choke coils 20 are disposed in the accommodation space 16 of the retainer 10 in a staggered manner to increase the area of the windward surfaces of the choke coils 20. When the fan unit 105 is actuated to blow wind to radiate heat for the choke coils 20, the choke coils 20 won't shield each other so as to radiate heat efficiently.

Figure 4:
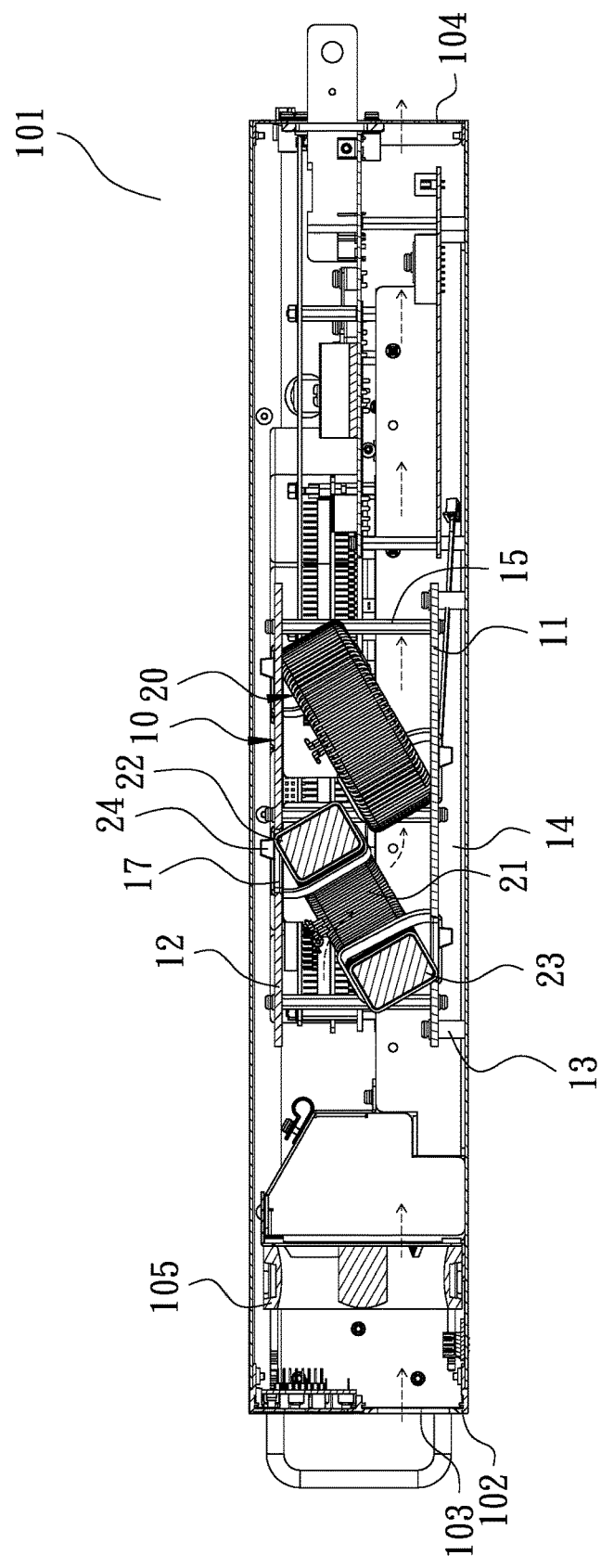
FIG. 4 is a sectional view of the present invention, showing the heat conduction of the choke coil module.

FIG. 4 is a sectional view of the present invention, showing the heat conduction of the choke coil module 100.

Since the lower plate 11 of the retainer 10 is fixedly connected to the bottom of the casing 102 through the plurality of support posts 13, the gap 14 is formed between the lower plate 11 of the retainer 10 and the bottom of the casing 102 so that a smooth heat dissipation path is formed below the choke coils 20. Further, the choke coils 22 and the through holes 22 slant from bottom to top toward the air outlets 104 of the casing 102. When the fan unit 105 guides the outside air for wind blowing, it is easy to guide the wind through the through holes 21 of the choke coils 20 to the lower portions of the choke coils 20 for heat dissipation. Compared to the aforesaid prior art that the choke coils are horizontally disposed, the choke coil module 100 disposed in a casing with a limited height (such as a casing with a height of below 2 U) has a wind heat dissipation path, not affected by the choke coils 20, and the heat won't be accumulated under the choke coils 20. The power inverter 101 won't fail due to overheating. The choke coil module 100 of present invention can be mounted in a smaller casing, such as a casing having a height of 2 U, to achieve excellent heat dissipation.

Although particular embodiments of the present invention have been described in detail for purposes of illustration, various modifications and enhancements may be made without departing from the spirit and scope of the present invention. Accordingly, the present invention is not to be limited except as by the appended claims.

What is claimed is:

1. A choke coil module of a high power density DC-AC power inverter, the power inverter comprising a casing, the choke coil module being disposed in the casing, two sides of the casing being formed with a plurality of air inlets and a plurality of air outlets respectively, one of the two sides of the casing being provided with a fan unit for guiding outside air to enter the casing from the air inlets and discharge from the air outlets, the choke coil module comprising:

a retainer, including a lower plate and an upper plate which are laterally spaced from each other, the lower plate being fixed to a bottom of the casing, the upper plate being located above the lower plate and connected to the lower plate with a plurality of longitudinal locking rods, the retainer being formed with an accommodation space between the upper plate and the lower plate, the upper plate and the lower plate each having at least one slot;

at least one choke coil, disposed obliquely in the accommodation space of the retainer, a top portion and a bottom portion of the choke coil protruding out of and leaning against the slots of the upper plate and the lower plate respectively;

in response to the power inverter being actuated, the choke coil generating heat, the outside air being guided by the fan unit to enter the casing through the air inlets, and the heat generated by the choke coil being expelled to the outside through the air outlets of the casing; and the retainer being formed with a plurality of fixing holes around a peripheral side of the slot of the upper plate and a peripheral side of the slot of the lower plate respectively, and the choke coil being fixed to the upper plate and the lower plate through a plurality of fastening wires and the fixing holes.

2. The choke coil module as claimed in claim 1, wherein choke coil module includes two choke coils, and the choke coils are disposed in the accommodation space of the retainer in a staggered manner.

3. The choke coil module as claimed in claim 1, wherein the slot of the upper plate and the slot of the lower plate have a rectangular shape.

4. The choke coil module as claimed in claim 1, wherein the choke coil has a through hole, and the choke coil and the through hole slant from bottom to top toward the air outlets of the casing.

5. The choke coil module as claimed in claim 1, wherein the lower plate of the retainer is fixedly connected to the bottom of the casing through a plurality of support posts, so that a gap is formed between the lower plate of the retainer and the bottom of the casing.

* * * * *